United States Patent
Simon et al.

(10) Patent No.: US 7,078,690 B2
(45) Date of Patent: Jul. 18, 2006

(54) MONITORING OF CONTACT HOLE PRODUCTION

(75) Inventors: Avi Simon, Rehovot (IL); Alexander Kadyshevitch, Moddieen (IL)

(73) Assignee: Applied Materials, Israel, Ltd., Rehovot (IL)

( * ) Notice: Subject to any disclaimer, the term of this patent is extended or adjusted under 35 U.S.C. 154(b) by 247 days.

(21) Appl. No.: 10/209,087

(22) Filed: Jul. 30, 2002

(65) Prior Publication Data

US 2003/0146381 A1    Aug. 7, 2003

Related U.S. Application Data

(60) Provisional application No. 60/354,361, filed on Feb. 4, 2002.

(51) Int. Cl.
*G01N 23/00* (2006.01)

(52) U.S. Cl. .................. 250/310; 324/751
(58) Field of Classification Search ........... 250/310, 250/311, 491.1, 492.1, 492.21, 492.22; 324/537, 324/751, 500–501, 522
See application file for complete search history.

(56) References Cited

U.S. PATENT DOCUMENTS 5,637,186 A * 6/1997 Liu et al. .................. 438/14

6,614,244 B1 * 9/2003 Yamada et al. ............. 324/751
2002/0070738 A1   6/2002 Yamada et al.

OTHER PUBLICATIONS

Yacobi, et al., Microanalysis of Solids, 1994 Plenum Press, New York, Chapters 1, 2 & 4.
Yamada, et al., *An In-Line Contact And Via Hole Inspection Method Using Electron Beam Compensation Current*, IEEE, 1999.
Model EKF-1000, Omicron Nanotechnology GmbH, Taunusstein, Germany. Available at: http://www.omicron.de/products/ekf1000, 2002.
PCT Written Opinion, "International Preliminary Examining Authority", PCT/US03/03494, (Jan. 27, 2005),7 pgs.

* cited by examiner

*Primary Examiner*—John R. Lee
*Assistant Examiner*—David A. Vanore
(74) *Attorney, Agent, or Firm*—Tarek N. Fahmi

(57) ABSTRACT

A method for production testing includes receiving a wafer including a semiconductor substrate and a non-conducting layer formed over the substrate, following etching of contact openings through the non-conducting layer to the substrate, the contact openings including an array of the contact openings arranged in a predefined test pattern in a test area on the wafer. An electron beam is directed to irradiate the test area, a specimen current flowing through the substrate responsive to the electron beam is measured. The specimen current is analyzed so as to assess a dimension of the contact openings.

32 Claims, 5 Drawing Sheets

MONITORING OF CONTACT HOLE PRODUCTION

RELATED APPLICATIONS

This patent hereby claims priority benefit of U.S. provisional application Ser. No. 60/354,361, filed at the Feb. 4, 2002.

FIELD OF THE INVENTION

The present invention relates generally to semiconductor device manufacturing and process control, and specifically to monitoring of contact holes produced in semiconductor wafers.

BACKGROUND OF THE INVENTION

Contact hole production is a common step in semiconductor device manufacturing. The contact holes are typically used to make electrical connections to a semiconductor or metal layer through an overlying non-conducting layer, such as an oxide layer. In order to produce contact holes, a layer of photoresist is deposited on the wafer surface. The photoresist is exposed to ultraviolet radiation, hardened and developed in order to form a "mask" over the wafer, with openings at the locations of the contact holes. Then the wafer is transferred to an etch station to form the contact holes through the non-conducting layer down to the semiconductor layer. The photoresist mask is then removed, and the contact holes are filled with metal. A similar process is used in producing trenches or vias in the wafer surface.

In order to ensure consistent device performance, the depth, width and bottom surface cleanliness of contact openings must be carefully controlled. (In the context of the present patent application and in the claims, the term "contact openings" refers to all structures of the type described above, including both contact holes, vias and trenches.) Deviations in the dimensions of contact openings can lead to variations in the contact resistance. If these variations are too large, they impact on device performance and can lead to loss of process yield. The manufacturing process must therefore be carefully monitored and controlled, in order to detect deviations in formation of contact openings as soon as they occur and to take corrective action to avoid the loss of costly wafers in process.

It is known in the art to use a scanning electron microscope (SEM) to inspect contact holes. The principles of the SEM and its use in microanalysis of semiconductor device structures are described, for example, by Yacobi et al., in Chapter 2 of *Microanalysis of Solids* (Plenum Press, New York, 1994), which is incorporated herein by reference. Because the contact holes are typically much deeper than they are wide, a special high aspect ratio (HAR) imaging mode is used. Open holes, which reach down through the dielectric layer to the semiconductor below, appear bright in the image, while closed holes, which do not fully expose the semiconductor layer, are dim.

HAR techniques using a SEM are time-consuming and costly to implement. They are also not capable of distinguishing between different types of blockages that can cause contact holes to be closed (for example, under-etching of the holes, as opposed to deposition of residues in the bottoms of the holes). Furthermore, HAR imaging techniques can generally be used only after the photoresist mask has been cleaned from the wafer surface. Consequently, there is no possibility of continuing the etching process if it is discovered upon inspection that the contact holes have been underetched.

An alternative method for contact hole inspection is described by Yamada et al., in "An In-Line Process Monitoring Method Using Electron Beam Induced Substrate Current," in *Microelectronics-Reliability* 41:3 (March 2001), pages 455–459, which is incorporated herein by reference. The compensation current in an electron beam system, also known as the specimen

SUMMARY OF THE INVENTION

It is an object of some aspects of the present invention to provide improved methods and systems for monitoring production of contact openings.

In preferred embodiments of the present invention, a test pattern is formed on a semiconductor wafer for the purpose of monitoring the production of contact openings. The test pattern comprises an array of contact openings (holes and/or trenches), having dimensions and other characteristics similar to contact holes and vias used in microelectronic devices fabricated on the wafer. Preferably, the test pattern is located in a non-functional area of the wafer, such as on a scribe line. Optionally, multiple test patterns of this sort are formed at different locations on the wafer, including either the same types and sizes or different types and sizes of openings.

The openings of the test pattern are etched into the wafer at the same time as the functional holes and/or trenches, using the same process. When the etch is believed to be complete, the wafer is inspected by directing an electron beam at the test pattern, and measuring the specimen current that is generated. The magnitude of the specimen current is compared to a predetermined calibration benchmark for the expected opening size and process parameters being used. Deviation of the measured current from the benchmark indicates that the holes have not been properly etched, so that corrective action can be taken. Preferably, the specimen current measurement is made before the photoresist mask used in the etching process is removed from the wafer. Thus, if the specimen current indicates that the openings are not deep enough or large enough, the etching process can be continued until the proper hole size is reached.

The use of an extended test pattern, with multiple openings, makes it possible to realize the present invention using a simple electron beam source of relatively low resolution, instead of a large, high-resolution SEM as in hole monitoring systems known in the art. As a result, it becomes practical to combine a test probe implementing the present invention with an etcher in the same chamber or in adjoining chambers, so that hole etching and contact hole testing can be performed together rapidly and conveniently without removing the wafer to ambient air. In some preferred embodiments of the present invention, the etching chamber and hole-monitoring test chamber are implemented as two stations in a cluster tool. Integrating contact hole metrology in this fashion with the actual production steps shortens the quality control feedback loop, so that when process defects occur, they can be detected and corrected more promptly, thus reducing lost yield.

There is therefore provided, in accordance with a preferred embodiment of the present invention, a method for production testing, including:

receiving a wafer including a semiconductor substrate and a non-conducting layer formed over the substrate, following etching of contact openings through the non-conducting layer to the substrate, the contact openings including an array of the contact openings arranged in a predefined test pattern in a test area on the wafer;

directing an electron beam to irradiate the test area;

measuring a specimen current flowing through the substrate responsive to the electron beam; and analyzing the specimen current so as to assess a dimension of the contact openings.

Typically, the contact openings include contact holes, vias or trenches.

Optionally, a secondary electron signal is measured and analyzed together with the specimen current.

Preferably, the test pattern is at least 10×10 µm in size and includes at least 100 of the contact openings. Most current, is defined as the absorbed current that flows from the primary electron beam to earth via the specimen (i.e., via the wafer). In other words, the specimen current is equal to the difference between the primary beam current and the total electron yield of the specimen due to secondary and backscattered electrons. The specimen current can be either positive or negative, depending on whether the energy of the primary electron beam is in the positive- or negative-charging domain of the specimen. Yamada et al. directed an electron beam at single holes and groups of holes in a $SiO_2$ surface layer overlying a silicon substrate, and measured the resultant compensation current. They found that the compensation current was a good indicator of hole-bottom oxide thickness, as well as of the hole diameter. preferably, directing the electron beam includes focusing the beam to an area approximately equal to the size of the test pattern.

In a preferred embodiment, receiving the wafer includes receiving the wafer with a photoresist layer overlying the non-conducting layer, the photoresist layer having been used in etching the contact openings, and measuring the specimen current includes determining the specimen current while irradiating the test area, prior to removing the photoresist layer. Preferably, if the specimen current indicates that the dimension of the contact openings is below a predetermined limit, further etching of the non-conducting layer using the photoresist layer is performed so as to increase the dimension.

Typically, at least some of the contact openings not included in the array belong to multiple microelectronic circuits on the wafer, wherein the circuits are separated by scribe lines, and the test area is preferably located on one of the scribe lines.

Preferably, the test area is one of a plurality of such test areas in different locations on the wafer, and directing the electron beam includes positioning at least one of the electron beam and the wafer so as to irradiate each of at least two of the test areas in turn.

In a preferred embodiment, directing the electron beam includes operating the electron beam during a precharge period so as to precharge the test area, and then operating the electron beam during a test period following the precharge period, while measuring the specimen current. Preferably, operating the electron beam during the precharge period includes applying a negative charge to a surface of the test area, while operating the electron beam during the test period includes setting the beam current low enough in order to work in a steady state regime for stable measurement, as well as setting an energy of the electron beam so as to enhance contrast between the bottom of the contact opening and dielectric materials.

In a further preferred embodiment, measuring the specimen current includes contacting a conductive contact pad fixed to the wafer adjacent to the test area, and measuring the current flowing through the contact pad. In an alternative embodiment, directing the electron beam comprises pulsing the electron beam while irradiating the test area, and measuring the specimen current comprises measuring the current by capacitive coupling to the wafer.

Preferably, analyzing the specimen current includes assessing at least one of a depth and a width of the contact openings.

In a preferred embodiment, analyzing the specimen current includes detecting a residue within the contact openings, and the method further includes irradiating the wafer with the electron beam so as to remove the residue.

There is also provided, in accordance with a preferred embodiment of the present invention, a method for producing microelectronic devices, including:

etching contact openings through a non-conducting layer on a wafer to a semiconductor substrate over which the non-conducting layer is formed, the contact openings including an array of the contact openings arranged in a predefined test pattern in a test area on the wafer;

directing an electron beam to irradiate the test area;

measuring a specimen current flowing through the substrate responsive to the electron beam; and analyzing the specimen current so as to assess a dimension of the contact openings.

There is additionally provided, in accordance with a preferred embodiment of the present invention, apparatus for production testing of a wafer that includes a semiconductor substrate and a non-conducting layer formed over the substrate, following etching of contact openings through the non-conducting layer to the substrate, the apparatus including:

an electron beam source, adapted to direct an electron beam to irradiate a test area on the wafer including an array of the contact openings arranged in a predefined test pattern;

a current measuring device, coupled to measure a specimen current flowing through the substrate responsive to the electron beam; and a controller, adapted to assess a dimension of the contact openings responsive to the measured specimen current.

Optionally, a secondary electron detector is also coupled to measure a signal due to the electrons emitted from the wafer as a result of the electron beam irradiation.

There is further provided, in accordance with a preferred embodiment of the present invention, a semiconductor wafer, including:

a semiconductor substrate; and a non-conducting layer formed over the substrate, and having a plurality of contact openings etched therethrough to the substrate, the contact openings including an array of the contact openings arranged in a predefined test pattern in a test area of the wafer.

There is moreover provided, in accordance with a preferred embodiment of the present invention, a cluster tool for producing microelectronic devices, including:

an etching station, which is adapted to etch a wafer that includes a semiconductor substrate and a non-conducting layer formed over the substrate, so as to produce contact openings through the non-conducting layer to the substrate, the contact openings including an array of the contact openings arranged in a predefined test pattern in a predefined test area of the wafer;

a testing station, including:

an electron beam source, adapted to direct an electron beam to irradiate the test area on the wafer; and a current measuring device, coupled to measure a specimen current flowing through the substrate responsive to the electron beam; and a controller, adapted to assess a dimension of the contact openings based on the measured specimen current, and to adjust an operating parameter of the etching tool responsive to the assessed dimension.

Preferably, the tool includes a robot, which is adapted to transfer the wafer from the etching tool to the testing tool, while the wafer is maintained a vacuum.

Further preferably, the controller is adapted, if the specimen current indicates that the dimension of the contact openings is below a predetermined limit, to cause the wafer to be returned to the etching station for further etching of the non-conducting layer so as to increase the dimension.

The present invention will be more fully understood from the following detailed description of the preferred embodiments thereof, taken together with the drawings in which:

DETAILED DESCRIPTION OF PREFERRED EMBODIMENTS

Figures 1A, 1B:
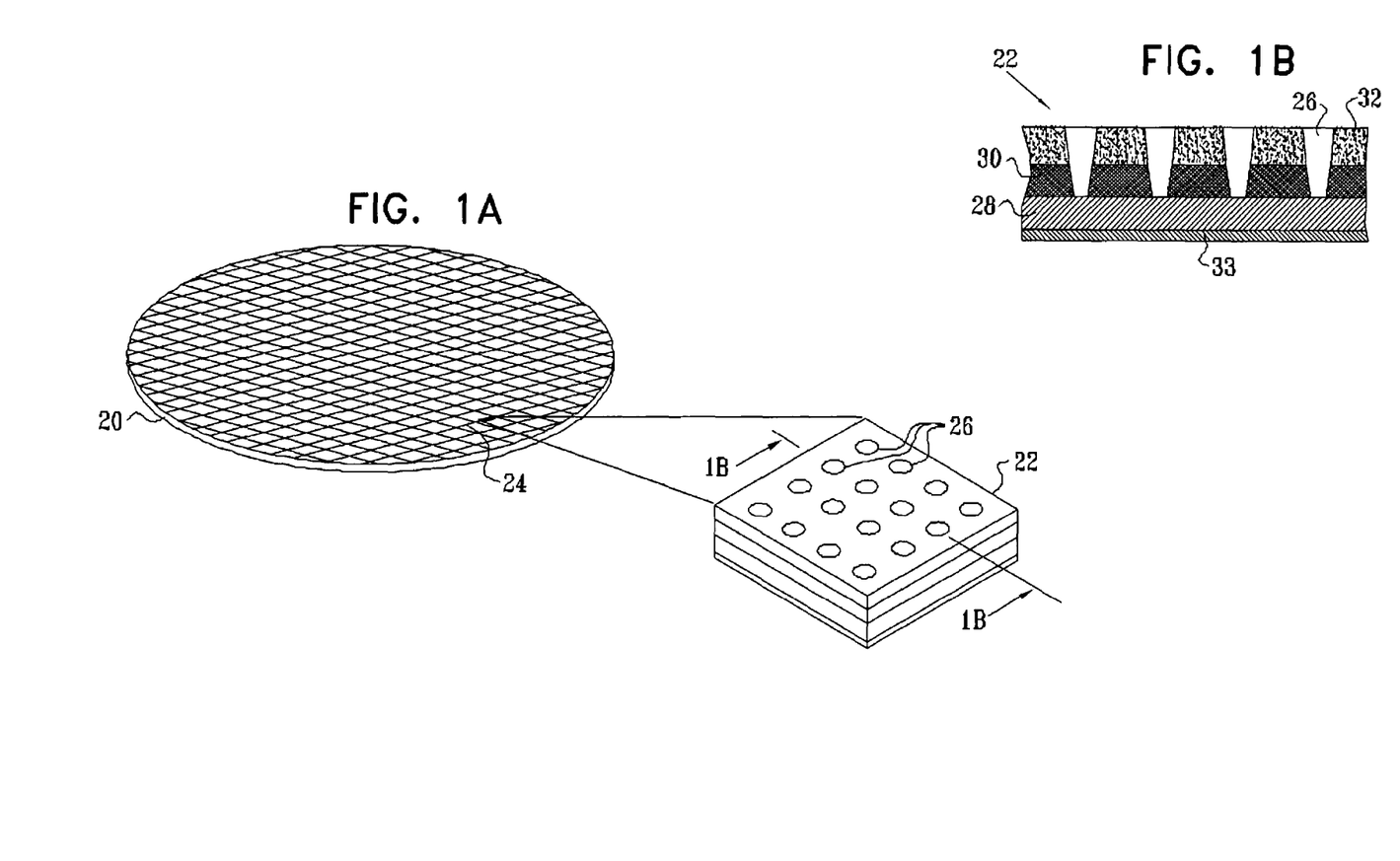
FIG. 1A is a schematic top view of a semiconductor wafer with a test pattern formed thereon, in accordance with a preferred embodiment of the present invention.
FIG. 1B is a schematic, sectional view of the test pattern of FIG. 1A, taken along a line 1B—1B.

Reference is now made to FIGS. 1A and 1B, which schematically illustrate a semiconductor wafer 20 and details of a test pattern 22 formed thereon, in accordance with a preferred embodiment of the present invention. FIG. 1A is a top view of the wafer, with the test pattern shown enlarged in an inset. FIG. 1B is an enlarged, cross-sectional view of the test pattern, taken along line 1B—1B in FIG. 1A. Although only the single test pattern 22 is shown in FIG. 1A, multiple test patterns may be distributed over the surface of wafer 20. Preferably, the test patterns are located on scribe lines 24 between adjacent dice on wafer 20, so as to minimize the loss of useful space on the wafer.

Test pattern 22 preferably comprises an array of holes 26. Typically, the holes are designed to be approximately 100 nm in diameter and are spaced between about 0.5 µm and 1 µm apart. The entire test pattern typically covers an area of at least 10×10 µm, and most preferably covers about 30×30 µm. These dimensions and spacing of the holes and of the test pattern are cited by way of example, however, and other dimensions and spacing may likewise be used. The dimensions and method of production of holes 26 are meant to follow as closely as possible the dimensions and method of production of contact holes in wafer 20. Although all of holes 26 are shown in the figures as having the same dimensions, holes of different sizes and shapes may be used as appropriate, either in the same test pattern location or at different locations on wafer 20. The test pattern preferably comprises a large number of holes, most preferably at least one hundred holes, in order to give a strong specimen current when wafer 20 is tested, as described below. The test pattern may also include other types of contact openings (not shown), such as trenches and vias.

Figure 3:
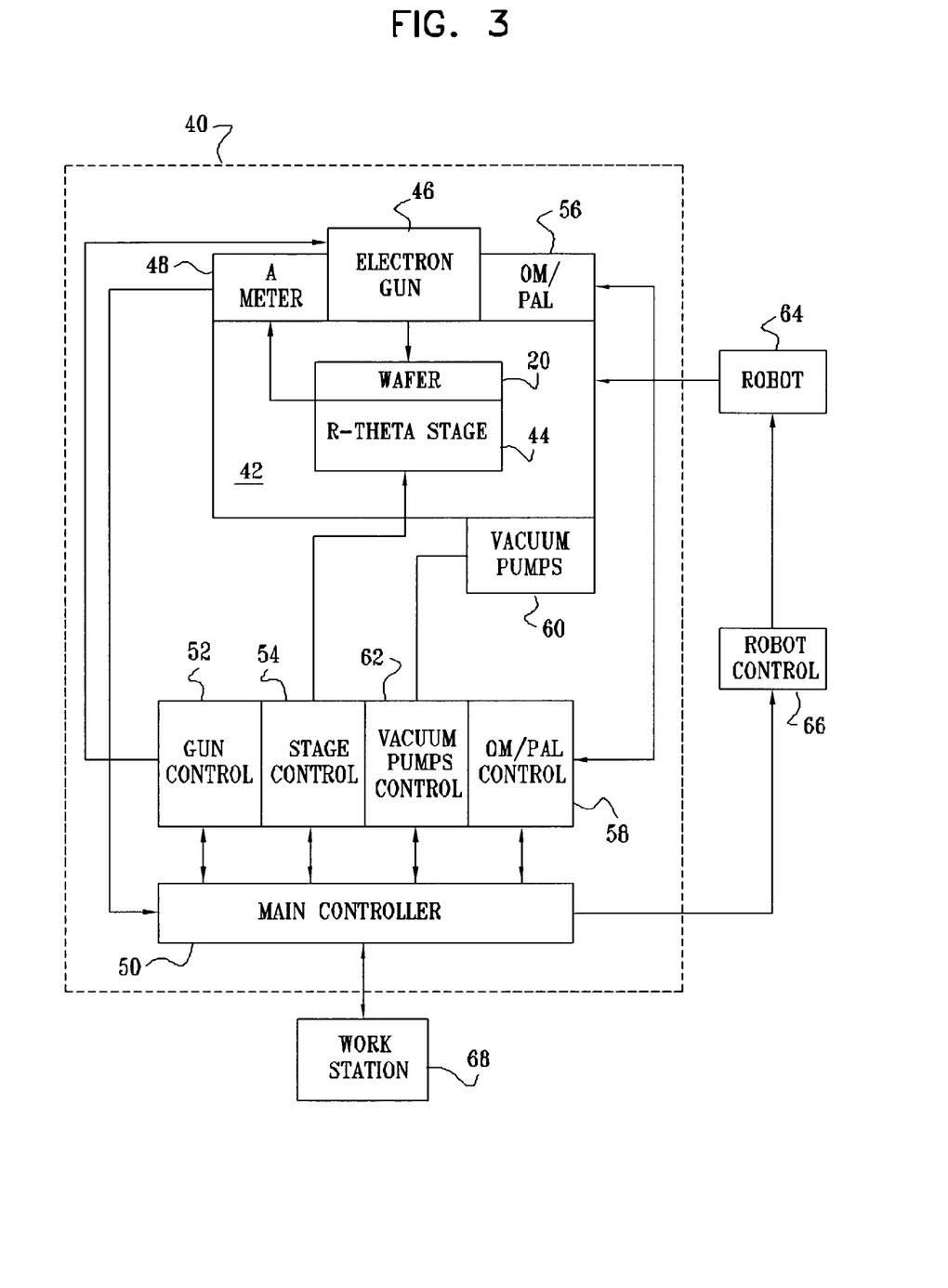
FIG. 3 is a block diagram that schematically illustrates apparatus for testing contact hole production, in accordance with a preferred embodiment of the present invention.
Figure 4:
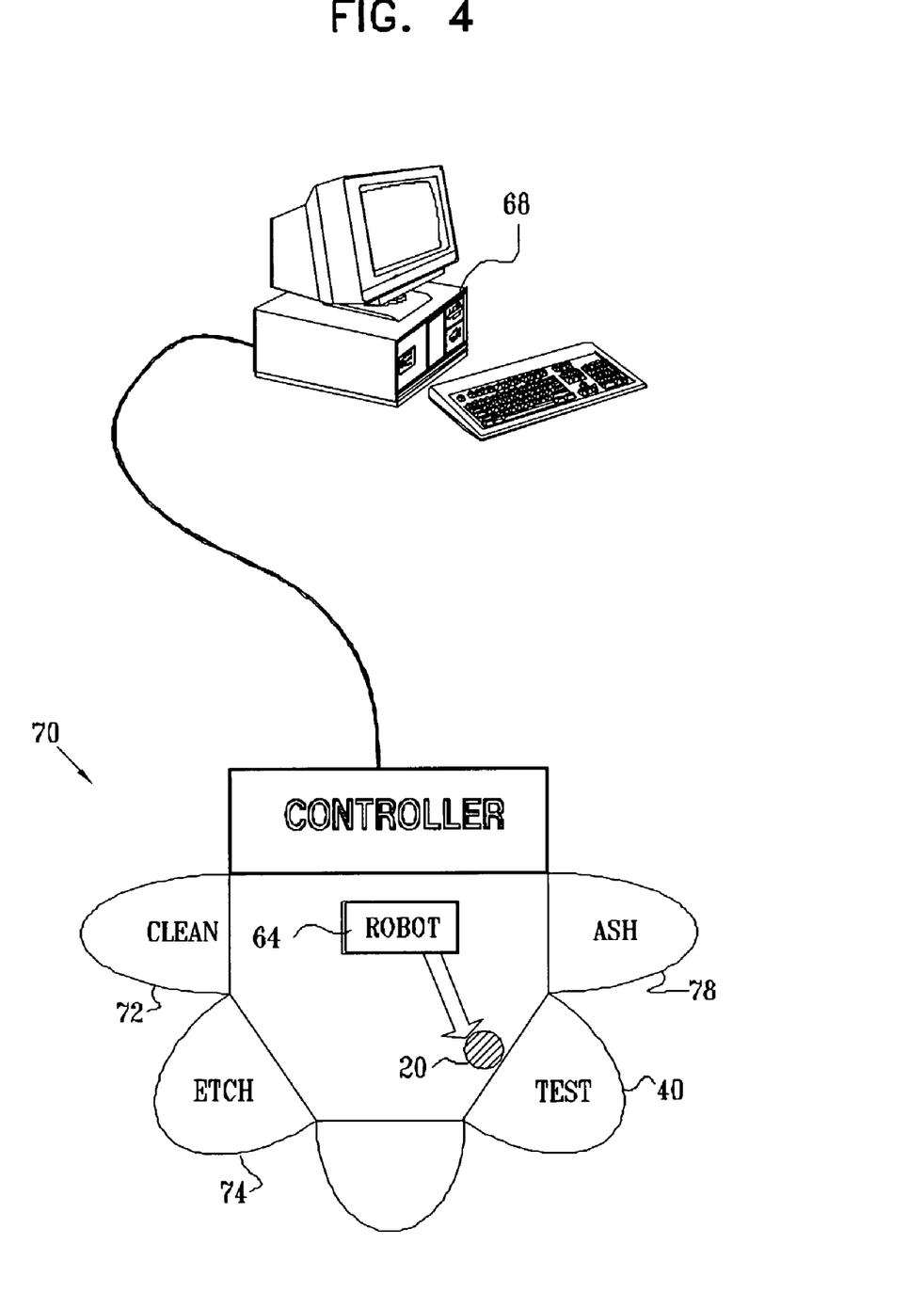
FIG. 4 is a schematic top view of a cluster tool that includes a contact hole test station, in accordance with a preferred embodiment of the present invention.
Figure 5:
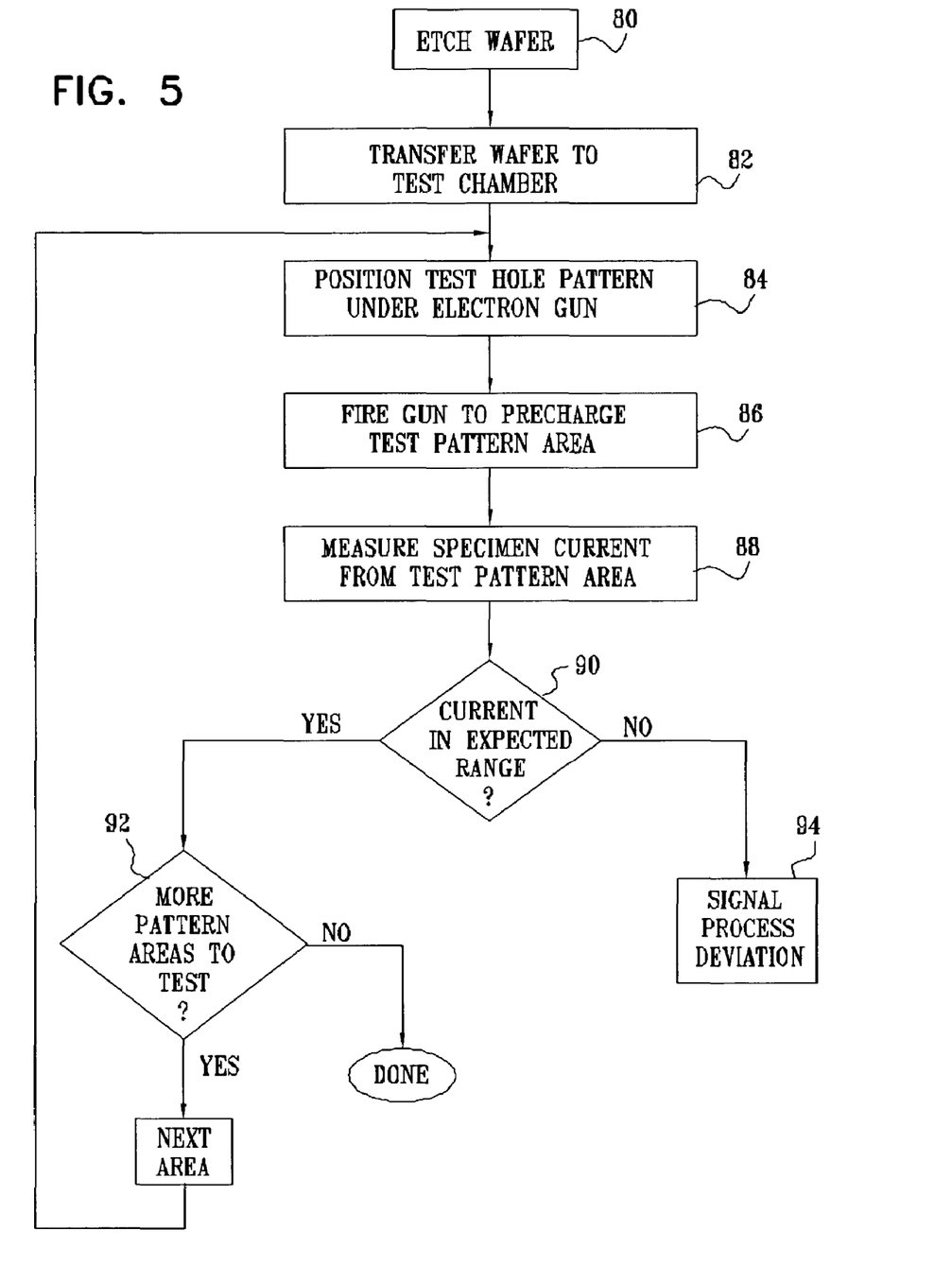
FIG. 5 is a flow chart that schematically illustrates a method for contact hole production and testing, in accordance with a preferred embodiment of the present invention.

In a typical application, a non-conducting oxide layer 30 is formed over a silicon substrate layer 28, and photoresist 32 is deposited on the oxide layer. Holes 26 are formed by the same processes of material deposition, photolithography and etching as are the functional circuit features on the wafer that pattern 22 is intended to test. Within holes 26, substrate layer 28 is exposed to the same extent as it is exposed by contact hole etching in functional areas of the wafer. A measurement of the specimen current generated when pattern 22 is irradiated by an electron beam is indicative of the extent to which layer 28 is exposed within the holes. To facilitate this measurement, a conductive contact pad 33 may be formed on the underside of wafer 20, below pattern 22. Apparatus and methods used in measuring the specimen current are shown in FIGS. 3–5 below and are described with reference thereto.

FIGS. 2A–2F are schematic, sectional illustrations of an area of a semiconductor wafer, showing formation of hole 26 under different process conditions. In the exemplary application shown in these figures, hole 26 is meant to provide a contact to a region 34 of substrate layer 28 that contains $TiSi_2$ for enhanced conductivity. Region 34 is typically part of a gate structure, formed within layer 28 by methods known in the art. Oxide layer 30 typically comprises materials such as undoped silicon glass (USG) or boron phosphorus silicon glass (BPSG) or low-k dielectrics, with the possible addition of a $Si_3N_4$ between the silicon substrate and the glass. The structure shown in these figures, however, is brought solely by way of example, and holes 26 may similarly be made in and adjacent to other structures.

Figure 2A:
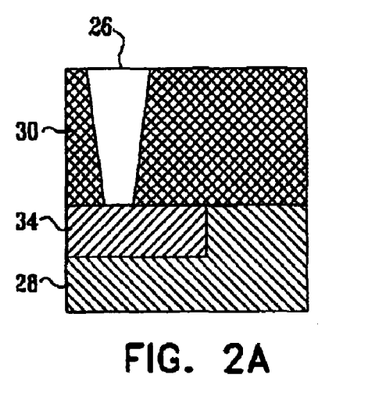
FIGS. 2A–2F are schematic, sectional illustrations of an area of a semiconductor wafer, showing a contact hole etched into the wafer under different process conditions.
Figure 2B:
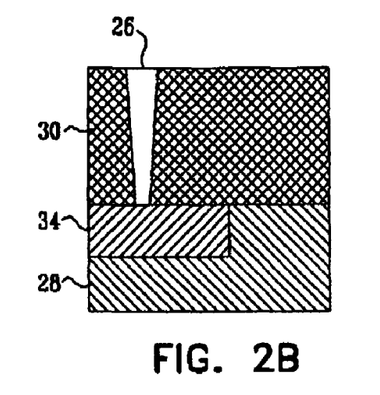

FIG. 2A shows a perfectly-etched, open hole, i.e., a contact hole that cleanly exposes layer 28 as desired. The remaining figures in this set show the results of different process defects. In FIG. 2B, hole 26 is underetched, typically due to a problem in the etching process or in the uniformity of oxide layer 30, for example. Consequently, the area of layer 28 that is exposed within hole 26 is smaller than it should be. In this case, the specimen current generated when the area of hole 26 is irradiated by an electron beam will be smaller than the benchmark current generated in the case of FIG. 2A. When the hole is filled with metal in order to contact layer 28, the contact resistance may be higher than it should.

Figure 2C:
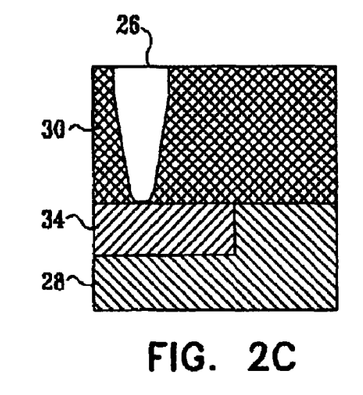

In FIG. 2C, the etching process is too strong or has continued for too much time, leading to overetching of hole 26. In this case, the specimen current will typically be greater than in the case of FIG. 2A. Overetching may have a deleterious effect on region 34 and on other structures, and may also lead to deposit of contaminants at the bottom of hole 26.

Figure 2D:
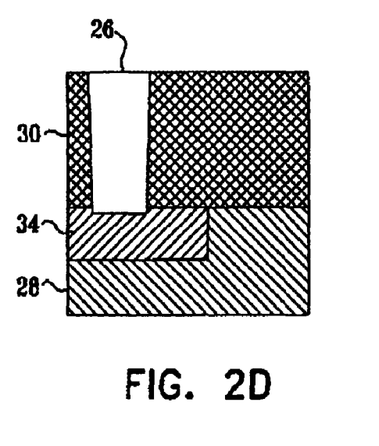

FIG. 2D shows a case of severe underetching, in which hole 26 stops short of reaching layer 28, typically due to some serious process defect. For this sort of closed contact hole, the measured specimen current will be very low, and the contact resistance when the hole is filled with metal will be very high.

Figure 2E:
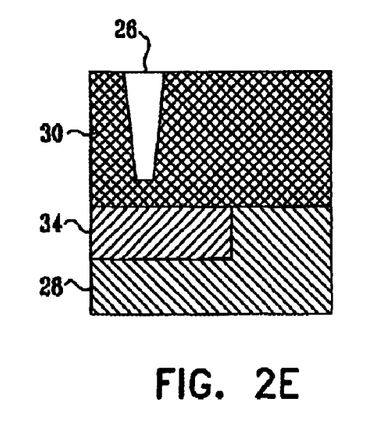
Figure 2F:
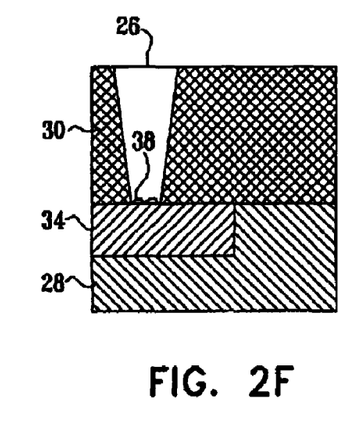

Finally, in FIG. 2E, although hole 26 was properly etched, a contaminant 38, such as photoresist polymer residue, is deposited at the bottom of the hole. This contaminant will typically cause a decrease in the measured specimen current. If the residue is not removed, it may cause a high contact resistance when hole 26 is filled with metal.

FIG. 3 is a block diagram that schematically illustrates a station 40 for contact hole inspection, in accordance with a preferred embodiment of the present invention. Station 40 comprises a chamber 42, containing a motion stage 44 on which wafer 20 is placed during inspection. An electron gun 46 directs an electron beam at wafer 20, while an ammeter 48 measures the specimen current generated in the wafer. The ammeter is electrically coupled to the lower side of wafer 20, in electrical contact with substrate layer 28, optionally by means of contact pad 33. The electron beam generated by gun 46 has a diameter that is roughly equal to the width of pattern 22, i.e., typically about 10–30 µm, as noted above. The electron energy of the gun is preferably variable, most preferably between about 500 and 5000 eV, so as to cover both positive and negative charging domains of the materials in wafer 20. (The positive charging domain is the range of electron energies in which the total yield of secondary and backscattered electrons from the surface layer is greater than the primary electron beam current, while the negative charging domain in the range in which the total yield is less than the primary beam current. These phenomena, which are well known in the art, are described in the above-mentioned book by Yacobi et al. on pages 38–39.) A suitable electron gun for this purpose, for example, is the EKF 1000 small-spot electron source, produced by Omicron NanoTechnology GmbH (Taunusstein, Germany). This gun is considerably smaller and less expensive than the high-resolution electron beam devices used in typical SEM systems.

Stage 44 positions wafer 20 so that test pattern 22 is properly located in the beam of gun 46. Given the large characteristic size (30 µm) of the pattern and of the electron beam, positioning resolution of about ±5 µm is generally sufficient. For simplicity and economy of space, stage 44 preferably comprises an R-theta (translation/rotation) stage. Alternatively or additionally, the stage may provide X-Y translation, or gun 46 may be translated over wafer 20, or the electron beam itself may be deflected. When test patterns are provided on wafer 20 at multiple locations, stage 44 may position the wafer (or the electron gun may be translated or its beam deflected) so that several of these test patterns are irradiated by the electron beam in succession. The specimen current is measured at each pattern location, in order to ensure that contact hole uniformity is maintained over the entire wafer. Additionally or alternatively, if different test patterns on the wafer are designed to test different sizes or shapes of contact openings, the specimen current is preferably measured for each pattern type. Optionally, the current of secondary electrons emitted from wafer 20 is measured simultaneously using a secondary electron detector 49, as is known in the art.

The positioning and operation of gun 46 and stage 44 are controlled by a main controller 50, via a gun control unit 52 and a stage control unit 54. Typically, a pre-alignment unit based on a low-resolution optical microscope (OM/PAL) 56 is used by controller 50, via an OM/PAL control unit 58, to locate the test pattern on the wafer for positioning and alignment purposes. Suitable microscopes for this purpose are made, for example, by Optem (Fairport, N.Y.). During operation, a vacuum is maintained in chamber 42 by a vacuum pump 60, which is also controlled and monitored by controller 50, via a vacuum control unit 62. A robot 64 inserts wafers into chamber 42 and removes them from the chamber. Controller 50 communicates with the robot via a robot control unit 66. Robot 64 is preferably used to transfer wafers to and from other stations in a cluster tool, as shown below in FIG. 4.

After positioning stage 44 and firing gun 46 to irradiate test pattern 22, controller 50 receives the specimen current measured by ammeter 48. It compares the measured current to a benchmark that has been established for the expected hole size, materials, etch conditions and other applicable process parameters. If the controller determines that the measured current is outside a predetermined tolerance range of the benchmark, it preferably interrupts the production process and notifies a system operator via a user workstation 68. The operator evaluates the test results and then implements whatever corrective action may be necessary. This action may include performing further etching, if the contact holes are underetched (as shown in FIG. 2B or 2D), or removing polymer residue that may have been deposited at the bottoms of the holes (FIG. 2E). In the latter case, it may be possible to remove the polymer film by high-density electron beam exposure, using electron gun 46. Thus, station 40 may be used for process correction, as well fault detection.

FIG. 4 is a schematic top view of a cluster tool 70 in which test station 40 is integrated, in accordance with a preferred embodiment of the present invention. This integration is made possible by the small size and simplicity of the components of station 40, and particularly of electron gun 46. As noted above, it is the use of test pattern 22 on wafer 20 for contact hole evaluation that enables such a small, simple electron gun to be used. Unlike the present technique, methods of contact hole evaluation known in the art, such as HAR imaging methods, are performed individually on single contact holes. The large, complex electron beam systems used in SEMs are not typically suited to integration in a cluster tool.

In the embodiment pictured in FIG. 4, robot 64 receives wafer 20 after photoresist 32 has been deposited over oxide layer 30 and has then been exposed by photolithography to form circuit features including test pattern 22. Since the interior of tool 70 is evacuated, robot 64 is able to transfer wafer 20 from chamber to chamber without exposing the wafer to ambient air. Typically, the wafer is first cleaned in a cleaning station 72, and is then inserted in an etching station 74. At this stage, holes 26 are formed through layer 30, preferably by a plasma etching process. The foregoing steps are known in the art and are described here solely by way of illustration. Other arrangements of the stations in tool 70 may similarly be used.

After etching holes 26 in wafer 20, the wafer is passed to test station 40. At this point, the wafer (except for the etched holes) is still covered by a layer of exposed photoresist. In station 40, the specimen current from wafer 20 is measured, and the results are evaluated by controller 50, as described above. If the specimen current is within the predetermined tolerance range of the applicable benchmark, the contact holes in the wafer are deemed to be acceptable. Robot 64 then moves wafer 20 into a plasma ashing station 78 for removal of the remaining photoresist. If desired, the contact hole test in chamber 40 may be repeated after the ashing stage. On the other hand, if the specimen current measured in station 40 is too low, indicating that the holes have been underetched, robot 64 may be instructed to return the wafer to etching station 74 for further etching, to be followed by re-test in station 40.

FIG. 5 is a flow chart that schematically illustrates a method for contact hole testing, in accordance with a preferred embodiment of the present invention. As described above, wafer 20 is first etched to produce holes 26, at an etching step 80, and the wafer is then transferred to chamber 42 of test station 40, at a transfer step 82. Stage 44 is operated to position test pattern 22 in the beam of electron gun 46, at a positioning step 84.

The specimen current from pattern 22 is preferably measured in steady state. For this purpose, the area of pattern 22 is first precharged by the beam from gun 46, at a precharging step 86. Preferably, the wafer surface is negatively precharged, by operating the electron gun at an energy in the negative charging domain (i.e., at which the total yield of backscattered and secondary electrons from the wafer is less than the primary electron beam current). For photoresist, as noted above, this condition typically holds for all values of the electron beam energy. For $SiO_2$, a higher beam energy, preferably above 2 keV, can be used to give negative charging. Negative precharging of the wafer surface causes holes 26 to act as Faraday cups, so that relatively few electrons escape from the holes.

Following the precharging step, the specimen current is measured while firing the electron gun, at a current measurement step 88. The electron beam energy and intensity used at step 88 may be either the same as or different from that used to precharge the wafer at step 86. Preferably, for the sake of measurement stability, the beam current used at step 88 is lower than the beam current used to precharge the wafer. Additionally or alternatively, for optimal contrast between good, open holes and those that are closed or underetched, the beam energy at step 88 is set to be in the positive charging domain of substrate layer 28. This choice of energy provides optimal specimen current contrast between substrate layer 28 and dielectric materials, thus increasing sensitivity to residual dielectric material at the bottom of the contact hole. If there is not a good ohmic contact between substrate layer 28 and ground (due to poor electrical contact with the wafer, for example), the electron beam may be pulsed, and the specimen current measured by capacitive coupling. In either case, the current is roughly proportional to the hole sizes. It decreases to the extent that unetched dielectric material or residues remain covering layer 28 within the holes. Optionally, a number of different electron beam energies may be used to test the specimen current at a number of different points on the yield curve. As a further option, noted above, the total secondary electron yield may also be measured using detector 49, in order to provide additional information that is complementary to the specimen current measurement.

After measuring the specimen current, controller 50 ascertains whether the measurements are within the specified range of the benchmark current for this test pattern, at a current comparison step 90. The benchmark current is preferably determined in advance using a suitable calibration procedure, and is stored in a memory of the controller. As noted above, the acceptable current range depends, inter alia, on the hole size, composition of the wafer layers and other process parameters. If the current is within the specified range, controller 50 checks its test program to determine whether there are further patterns to test on this wafer, at a program checking step 92. If so, the controller selects the next area and repositions the wafer accordingly, at step 84. Steps 86–90 are then repeated.

If the measured specimen current is found to be out of range at step 90, controller 50 informs workstation 68 of the deviation, at a fault notification step 94. The operator of system 70 may then take corrective action, as noted above. This action may include, for example, further etching of wafer 20, diagnostic tests to determine the source and nature of the problem, and/or adjustment of process parameters so that contact holes in future wafers are properly etched. As noted above, if a polymer film is found at the bottom of the contact holes, electron gun 46 may be used to remove the film.

Although the preferred embodiments described hereinabove are directed particularly to contact hole monitoring, the principles of the present invention may also be applied to other quality control tasks, such as measurement and monitoring of other feature dimensions (particularly critical dimensions) in the semiconductor wafer fabrication process. The methods of the present invention provide an indication both of the width of such features and of the thickness of layers making up the features. These methods can be adapted for use not only before metal deposition, as in the embodiments described above, but also after metal deposition to inspect contacts, interconnects and metal lines for disconnects, short circuits and other defects.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for production testing, comprising:
  receiving a wafer comprising a semiconductor substrate, a non-conducting layer formed over the substrate, and a photoresist layer overlying the non-conducting layer, following etching of contact openings through the non-conducting layer to the substrate, the photoresist layer having been used in etching the contact openings, wherein the contact openings comprising comprise an array of the contact openings arranged in a predefined test pattern in a test area on the wafer;
  directing an electron beam to irradiate the test area;
  measuring a specimen current flowing through the substrate responsive to the electron beam before removal of the photoresist layer; and
  analyzing the specimen current so as to assess a dimension of the contact openings.

2. A method according to claim 1, wherein the contact openings comprise contact holes.

3. A method according to claim 1, wherein the contact openings comprise trenches.

4. A method according to claim 1, wherein the test pattern is at least 10×10 µm in size.

5. A method according to claim 4, wherein the test pattern comprises at least 100 of the contact openings.

6. A method according to claim 4, wherein directing the electron beam comprises focusing the beam to an area approximately equal to the size of the test pattern.

7. A method according to claim 1, and further comprising, if the specimen current indicates that the dimension of the contact openings is below a predetermined limit, further etching the non-conducting layer using the photoresist layer so as to increase the dimension.

8. A method according to claim 1, wherein the wafer includes multiple microelectronic circuits thereon, wherein the circuits are separated by scribe lines, and the test area is located on one of the scribe lines.

9. A method according to claim 1, wherein the test area is one of a plurality of such test areas in different locations on the wafer, and wherein directing the electron beam comprises positioning at least one of the electron beam and the wafer so as to irradiate each of at least two of the test areas in turn.

10. A method according to claim 1, wherein directing the electron beam comprises operating the electron beam during a precharge period so as to precharge the test area, and then operating the electron beam during a test period following the pre charge period, while measuring the specimen current.

11. A method according to claim 10, wherein operating the electron beam during the precharge period comprises applying a negative charge to a surface of the test area.

12. A method according to claim 11, wherein operating the electron beam during the test period comprises setting an energy of the electron beam in a positive charging domain of the substrate.

13. A method according to claim 1, wherein measuring the specimen current comprises contacting a conductive contact pad fixed to the wafer adjacent to the test area, and measuring the current flowing through the contact pad.

14. A method according to claim 1, wherein directing the electron beam comprises pulsing the electron beam while irradiating the test area, and wherein measuring the specimen current comprises measuring the current by capacitive coupling to the wafer.

15. A method according to claim 1, wherein analyzing the specimen current comprises assessing at least one of a depth and a width of the contact openings.

16. A method according to claim 1, and comprising measuring a secondary electron current emitted from the substrate responsive to the electron beam, and analyzing the secondary electron current together with the specimen current.

17. A method according to claim 1, wherein analyzing the specimen current comprises detecting a residue within the contact openings, and comprising irradiating the wafer with the electron beam so as to remove the residue.

18. A method for production testing, comprising:
receiving a wafer comprising a semiconductor substrate and a non-conducting layer formed over the substrate, following etching of contact openings through the non-conducting layer to the substrate, the contact openings comprising an array of the contact openings arranged in a predefined test pattern in a test area on the wafer;
directing an electron beam to irradiate the test area;
measuring a specimen current flowing through the substrate responsive to the electron beam;
detecting a residue within an least one contact opening of the contact openings by analyzing the specimen current so as to assess a dimension of the contact openings; and
irradiating the wafer with the electron beam so as to remove the detected residue from the at least one contact opening.

19. A method according to claim 18, wherein the contact openings comprise contact holes.

20. A method according to claim 18, wherein the contact openings comprise trenches.

21. A method according to claim 18, wherein the test pattern is at least 10×10 μm in size.

22. A method according to claim 21, wherein the test pattern comprises at least 100 of the contact openings.

23. A method according to claim 21, wherein directing the electron beam comprises focusing the beam to an area approximately equal to the size of the test pattern.

24. A method according to claim 18, wherein the wafer includes multiple microelectronic circuits thereon, wherein the circuits are separated by scribe lines, and the test area is located on one of the scribe lines.

25. A method according to claim 18, wherein the test area is one of a plurality of such test areas in different locations on the wafer, and wherein directing the electron beam comprises positioning at least one of the electron beam and the wafer so as to irradiate each of at least two of the test areas in turn.

26. A method according to claim 18, wherein directing the electron beam comprises operating the electron beam during a precharge period so as to precharge the test area, and then operating the electron beam during a test period following the pre charge period, while measuring the specimen current.

27. A method according to claim 26, wherein operating the electron beam during the precharge period comprises applying a negative charge to a surface of the test area.

28. A method according to claim 27, wherein operating the electron beam during the test period comprises setting an energy of the electron beam in a positive charging domain of the substrate.

29. A method according to claim 18, wherein measuring the specimen current comprises contacting a conductive contact pad fixed to the wafer adjacent to the test area, and measuring the current flowing through the contact pad.

30. A method according to claim 18, wherein directing the electron beam comprises pulsing the electron beam while irradiating the test area, and wherein measuring the specimen current comprises measuring the current by capacitive coupling to the wafer.

31. A method according to claim 18, wherein analyzing the specimen current comprises assessing at least one of a depth and a width of the contact openings.

32. A method according to claim 18, and comprising measuring a secondary electron current emitted from the substrate responsive to the electron beam, and analyzing the secondary electron current together with the specimen current.

* * * * *